US006621360B1

(12) United States Patent
Xu et al.

(10) Patent No.: US 6,621,360 B1
(45) Date of Patent: Sep. 16, 2003

(54) EXTENDED FREQUENCY RANGE VOLTAGE-CONTROLLED OSCILLATOR

(75) Inventors: Chao Xu, Allentown, PA (US); Bijit Thakorbhai Patel, Breinigsville, PA (US)

(73) Assignee: PMC-Sierra, Inc., Santa Clara, CA (US)

( * ) Notice: Subject to any disclaimer, the term of this patent is extended or adjusted under 35 U.S.C. 154(b) by 62 days.

(21) Appl. No.: 10/056,412

(22) Filed: Jan. 22, 2002

(51) Int. Cl.[7] .............................................. H03B 27/00

(52) U.S. Cl. .......................... 331/57; 331/175; 327/108

(58) Field of Search .................. 331/57, 175; 327/108, 327/109, 111

(56) References Cited

U.S. PATENT DOCUMENTS 5,285,059 A * 2/1994 Nakata et al. .............. 250/205
5,818,304 A 10/1998 Hogeboom
6,072,372 A 6/2000 Yokoyama
6,188,289 B1 2/2001 Hyeon
6,275,116 B1 8/2001 Abugharbieh et al.
6,466,100 B2 * 10/2002 Mullgrav, Jr. et al. ...... 331/179

* cited by examiner

*Primary Examiner*—Henry Choe
(74) *Attorney, Agent, or Firm*—Oyen Wiggs Green & Mutala

(57) ABSTRACT

VCO frequency is continuously variable through a wide frequency range in proportion to a first control voltage VC produced by a PLL containing the VCO. A second control voltage NVC is produced as a monotonically decreasing function of VC. A first current $I_0$ is produced in proportion to VC and a second current $I_1$ is produced in proportion to NVC. $I_1$ is subtracted from $I_0$, producing a control current $IC=I_0-I_1$ which is applied to the VCO.

7 Claims, 3 Drawing Sheets

VC
NEGATIVE FEEDBACK CONTROL VOLTAGE GENERATOR
NVC
V-I CONVERTER
D
IC
34
36
$V_{dd}$
P1
$V_{bias}$
N2
NVC
VC
N1
IC
38
40
VC
$I_0$
$I_1$
NVC

EXTENDED FREQUENCY RANGE VOLTAGE-CONTROLLED OSCILLATOR

TECHNICAL FIELD

The invention provides a wide frequency range voltage-controlled oscillator (VCO) which utilizes negative feedback of the control voltage output by a phase locked loop (PLL) to adjust the VCO's frequency.

BACKGROUND

Phase-locked loops (PLLs) are widely used in a variety of communications and control systems applications, including frequency synthesis, clock recovery, signal modulation and signal demodulation applications. A typical analog PLL incorporates a phase detector, a voltage-controlled oscillator (VCO) and a low pass filter. In some applications, it is desirable that the frequency of the VCO's output clock signal be variable within a wide frequency range.

FIG. 1 schematically depicts a voltage-controlled ring oscillator—a common prior art VCO architecture formed by connecting a plurality of delay cells 10, 12 . . . 14 in a closed loop. The output clock frequency is determined by the delay contributed by each delay cell, which is in turn controlled by the PLL's output control voltage VC, as shown schematically in FIG. 2 for a representative delay cell D. If the FIG. 1 VCO is to be variable within a wide frequency range, then each delay cell must have a correspondingly wide delay tuning range.

Each delay cell D typically comprises two transistors (not shown) coupled to form a differential pair, and some active loading components (not shown). Each delay cell D sinks a tail current $I_{tail}$ through voltage-to-current converter 16. Each delay cell D's delay value is determined by that cell's $I_{tail}$ value, which is in turn determined by the control voltage VC. Accordingly, the delay tuning range of each delay cell D is limited by the voltage range within which VC can be varied, which is in turn constrained by the power supply voltage, i.e. $0 \leqq VC \leqq V_{dd}$. More particularly delay cell D's output frequency f is a function of both $I_{tail}$ and VC. Consequently, and as shown in FIG. 3, if $I_{tail}$ is too small, f is constrained within a relatively low frequency sub-range $[f_{L1},f_{H1}]$ as indicated at 18; whereas, if $I_{tail}$ is too large, f is constrained within a relatively high frequency sub-range $[f_{L2},f_{H2}]$ as indicated at 20.

If an offset current source 22 is connected in parallel across voltage-to-current converter 16 as shown in FIG. 4, then the output frequency f can be controlled as a function of both the tail current $I_{tail}$ sunk through voltage-to-current converter 16 (which is determined by VC as aforesaid) and the offset current $I_{offset}$ sunk through offset current source 22. A digital counter or similar means (not shown) can be used to control offset current source 22 so as to vary $I_{offset}$ through a range of discrete values $I_{offset1}$, $I_{offset2}$, $I_{offset3}$, $I_{offset4}$, $I_{offset5}$, etc. By selectably controlling $I_{offset}$ in this fashion one may select any one of a corresponding number of discrete frequency operating sub-ranges $[f_{L1},f_{H1}]$, $[f_{L2},f_{H2}]$, $[f_{L3},f_{H3}]$, $[f_{L4},f_{H4}]$, $[f_{L5},f_{H5}]$, etc. as indicated at 24, 26, 28, 30, 32 respectively in FIG. 5.

The discrete $I_{offset}$ values, and consequently the discrete frequency operating sub-ranges of the FIG. 4 apparatus are undesirably affected by changes in integrated circuit process and operating temperature conditions. The FIG. 4 apparatus also requires presetting of digital registers, initialization of comparator reference voltages, or some similar operation in order to select a particular one of the discrete frequency operating sub-ranges. It is difficult to ensure that all such preset or initialization values will produce the desired frequency operating sub-range under all integrated circuit process and operating temperature conditions which are likely to be encountered. Moreover, the PLL locking time is increased by the delay inherent in changing the preset or initialization values in order to select a different frequency operating sub-range.

SUMMARY OF INVENTION

The invention provides a method and apparatus for continuously varying VCO frequency through a wide frequency range in proportion to a first control voltage VC produced by a PLL containing the VCO. A second control voltage NVC is produced as a monotonically decreasing function of VC. A first current $I_0$ is produced in proportion to VC and a second current $I_1$ is produced in proportion to NVC. $I_1$ is subtracted from $I_0$, producing a control current $IC=I_0-I_1$ which is applied to the VCO.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 6:
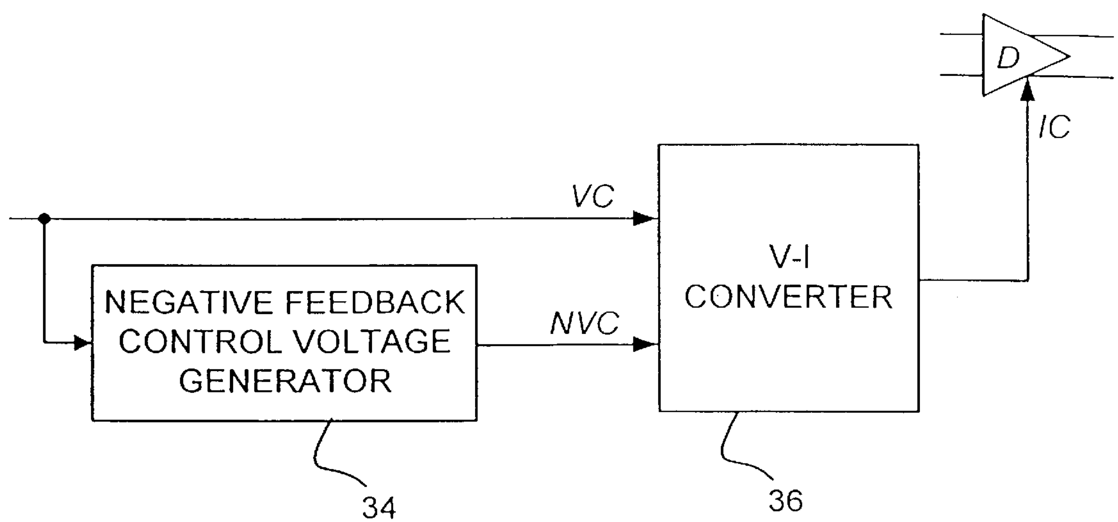
FIG. 6 is a block diagram representation of a negative feedback VCO control scheme in accordance with the invention.

As shown in FIG. 6, the invention incorporates a negative feedback control voltage generator 34 and a voltage-to-current (V-I) converter 36. As hereinafter explained, negative feedback control voltage generator 34 converts the control voltage VC supplied by a PLL (not shown) to a negative feedback control voltage NVC and applies NVC to one of V-I converter 36's two input ports. VC is applied to V-I converter 36's other input port. As is also hereinafter explained, V-I converter 36 utilizes VC and NVC to produce a control current IC which is applied to delay cell D to control the cell's delay value. Delay cell D can be a conventional prior art delay cell and accordingly need not be described further.

Figure 7:
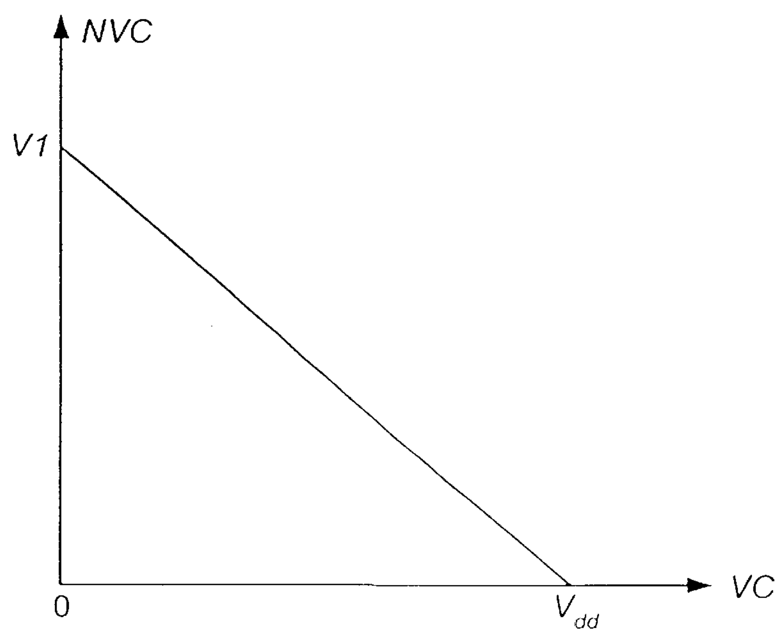
FIG. 7 graphically depicts the voltage transfer function of the negative feedback voltage generator portion of the FIG. 6 apparatus.

As depicted in FIG. 7, negative feedback control voltage generator 34 has a monotonic (not necessarily linear) decreasing transfer function such that if VC is low NVC is high, and vice versa. Negative feedback control voltage generator 34 automatically and continuously adjusts NVC as VC changes, without any need for presetting of digital registers, initialization of comparator reference voltages, etc.

Figure 8:
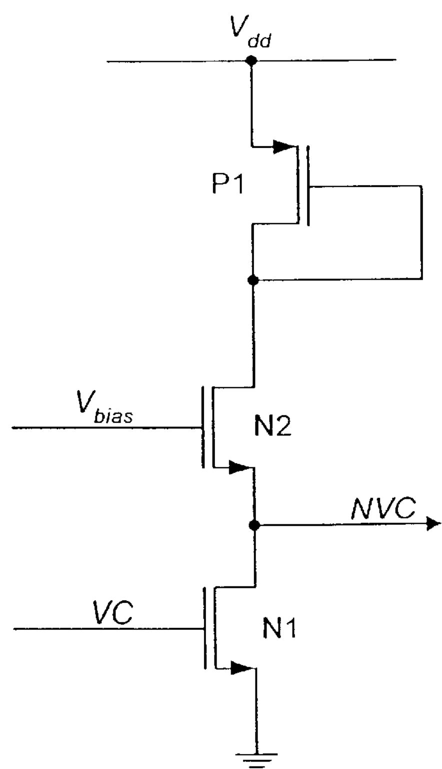
FIG. 8 is an electronic circuit schematic depicting one embodiment of a negative feedback voltage generator in accordance with the invention.

FIG. 8 depicts one possible embodiment of negative feedback control voltage generator 34 incorporating two NMOS transistors N1, N2 and one PMOS transistor P1. The power supply voltage $V_{dd}$ is applied to P1's source. P1's gate is connected to P1's drain (i.e. P1 is diode-connected to function as a load). N2's drain is also connected to P1's drain. N1's drain is connected to N2's source and N1's source is grounded (i.e. N1 is configured as a single stage common source amplifier). The PLL control voltage VC is applied to N1's gate and a biasing voltage $V_{bias}$ is applied to N2's gate to match negative feedback control voltage generator 34 to delay cell D. The desired NVC output signal is provided at N1's drain. When VC is low, N1 operates in its cut-off region, pulling N1's drain to a high voltage. When VC is high, N1 turns on, pulling N1's drain voltage almost to ground, such that the output voltage NVC is very small.

Figure 9:
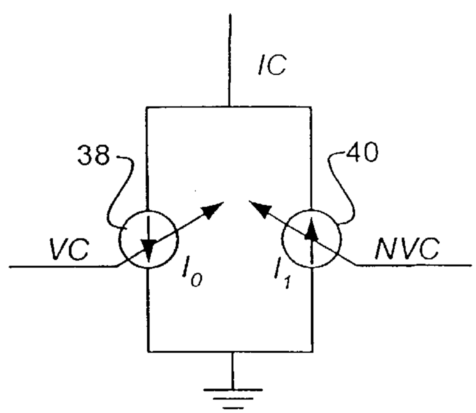
FIG. 9 schematically depicts one embodiment of a voltage-to-current converter in accordance with the invention.

As previously explained, VC and NVC are applied to the respective inputs of V-I converter 36 which thereupon produces control current IC for application to each delay cell in the VCO. More particularly, if VC is small and NVC is large, V-I converter 36 produces a correspondingly small IC. Conversely, if VC is large and NVC is small, V-I converter 36 produces a correspondingly large IC. FIG. 9 depicts one possible embodiment of V-I converter 36 incorporating opposite polarity voltage-controlled DC current sources 38, 40 connected in parallel. Current source 38 is controlled by the PLL control voltage VC and produces an output current $I_0$. Current source 40 is controlled by the negative feedback control voltage NVC and produces an output current $I_1$. The resultant control current $IC=I_0-I_1$.

Figure 10:
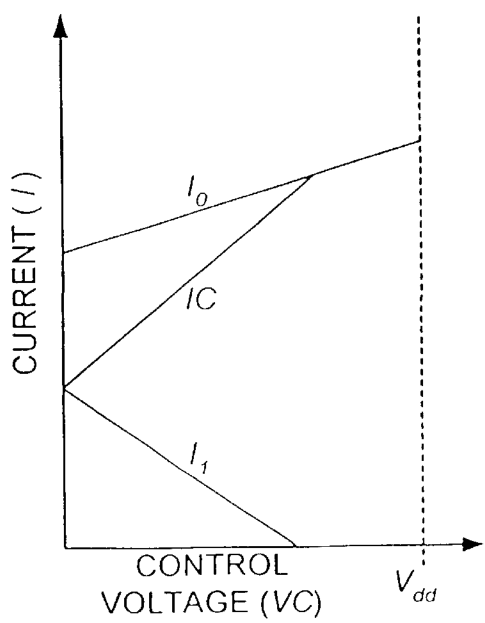
FIG. 10 graphically depicts the output current to input voltage transfer function of the FIG. 9 apparatus.

FIG. 10 graphically depicts V-I converter 36's output current to input voltage transfer function. As can be seen, $I_0$ increases as the PLL control voltage VC increases, whereas $I_1$ decreases as VC increases. If VC is small, the resultant control current IC is small, even if $I_0$ is relatively large, due to the current subtracting effect of the lower $I_1$ value. Conversely, if VC is large, IC is large since $I_1$ becomes negligible and IC approaches $I_0$ as VC approaches its maximum.

Figure 1:
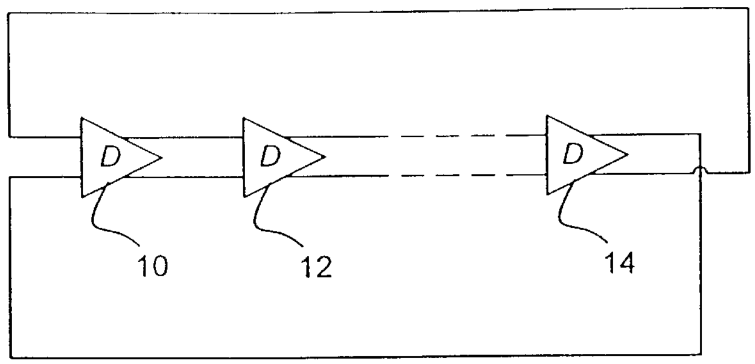
FIG. 1 schematically depicts a prior art voltage-controlled ring oscillator.
Figure 2:
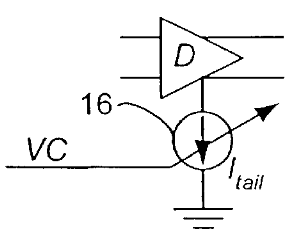
FIG. 2 schematically depicts a prior art voltage controlled delay cell.
Figure 4:
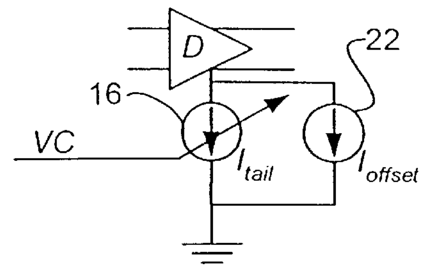
FIG. 4 schematically depicts a prior art voltage controlled delay cell having an offset current source.
Figure 3:
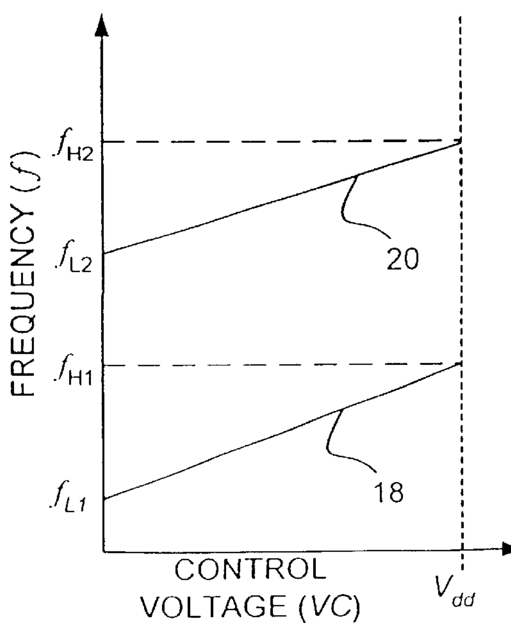
FIG. 3 graphically depicts the output clock frequency to input voltage transfer function of the FIG. 2 apparatus.
Figure 5:
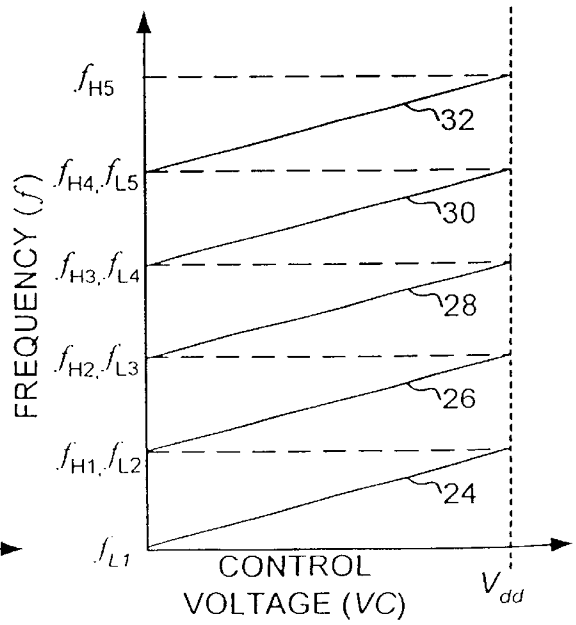
FIG. 5 graphically depicts the output clock frequency to input voltage transfer function of the FIG. 4 apparatus.
Figure 11:
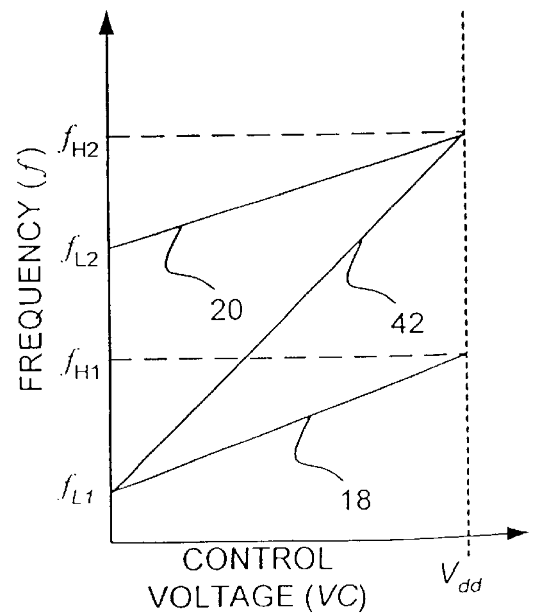
FIG. 11 graphically depicts the output clock frequency to input voltage transfer function of the FIG. 9 apparatus.

In operation, when the PLL's reference clock frequency is low, the PLL produces a low control voltage VC. Consequently, negative feedback control voltage generator 34 produces a correspondingly high negative feedback control voltage NVC. When applied to the respective inputs of V-I converter 36, the low VC and high NVC produce a low control current IC which can be applied to the VCO to generate a low frequency to lock the PLL. Conversely, when the PLL's reference clock frequency is high, VC is high, causing negative feedback control voltage generator 34 to produce a correspondingly low NVC. When applied to V-I converter 36, the high VC and low NVC produce a high IC which can be applied to the VCO to generate a high frequency to lock the PLL. FIG. 11 reproduces the relatively low $[f_{L1},f_{H1}]$ and relatively high $[f_{L2},f_{H2}]$ prior art frequency sub-ranges 18, 20 previously described with reference to FIG. 3, and also shows the extended frequency range $[f_{L1},f_{H2}]$ 42 attainable by the invention.

Persons skilled in the art will appreciate that the invention extends the VCO frequency tuning range without dividing the tuning range into discrete frequency sub-ranges which must be selected by time consuming presetting of digital registers, initialization of comparator reference voltages, etc. Automatic, continuously variable frequency tuning is achieved solely by adjusting the control voltage VC, independently of changes in integrated circuit process and operating temperature conditions.

What is claimed is:

1. A method of producing a control current IC in response to a first control voltage VC, said method comprising:

(a) producing a second control voltage NVC as a monotonically decreasing function of said first control voltage VC;

(b) producing a first current $I_0$ proportional to said first control voltage VC;

(c) producing a second current $I_1$ proportional to said second control voltage NVC; and, (d) subtracting said second current from said first current to produce said control current $IC=I_0-I_1$.

2. A method of controlling the frequency of a voltage-controlled oscillator in response to a first control voltage VC produced by a phase locked loop containing said voltage-controlled oscillator, said method comprising:

(a) producing a second control voltage NVC as a monotonically decreasing function of said first control voltage VC;

(b) producing a first current $I_0$ proportional to said first control voltage VC;

(c) producing a second current $I_1$ proportional to said second control voltage NVC;

(d) subtracting said second current from said first current to produce said control current $IC=I_0-I_1$; and, (e) applying said control current IC to said voltage-controlled oscillator.

3. A method as defined in claim 2, wherein said frequency is continuously variable throughout a selected frequency range in proportion to said first control voltage VC.

4. A voltage-controlled oscillator current controller for producing a control current IC in response to a first control voltage VC, said current controller comprising:

(a) a voltage generator for receiving said first control voltage VC and producing an a second control voltage NVC as a monotonically decreasing function of said first control voltage VC;

(b) a voltage-to-current converter for:

(i) receiving said first control voltage VC and producing a first current $I_0$ proportional to said first control voltage VC;

(ii) receiving said second control voltage NVC and producing a second current $I_1$ proportional to said second control voltage NVC; and, (iii) subtracting said second current from said first current to produce said control current $IC=I_0-I_1$.

5. A voltage-controlled oscillator current controller as defined in claim 4, said voltage-to-current converter further comprising:

(a) a first voltage-controlled current source for producing said first current $I_0$; and, (b) a second voltage-controlled current source connected in parallel with said first voltage-controlled current source, said second voltage-controlled current source for producing said second current $I_1$;

wherein said first control voltage VC is applied to control said first voltage-controlled current source and said second control voltage NVC is applied to control said second voltage-controlled current source.

6. A voltage-controlled oscillator current controller as defined in claim 4, said voltage generator further comprising:

(a) a first NMOS transistor having a gate, a source and a drain;

(b) a second NMOS transistor having a gate, a source and a drain;

(c) a load;

wherein:

(i) a logic high voltage is applied through said load to said second NMOS transistor drain;

(ii) said first NMOS transistor drain is connected to second NMOS transistor source;

(iii) a logic low voltage is applied to said first NMOS transistor source;

(iv) said first control voltage VC is applied to said first NMOS transistor gate; and, (v) a biasing voltage is applied to said second NMOS transistor gate.

7. A voltage-controlled oscillator current controller as defined in claim 6, said load further comprising a PMOS transistor having a gate, a source and a drain, and wherein:

(i) said logic high voltage is applied to said PMOS transistor source; and, (ii) said PMOS transistor gate is connected to said PMOS transistor drain and to said second NMOS transistor drain.

* * * * *